(12) United States Patent
van der Straten et al.

(10) Patent No.: US 12,402,536 B2
(45) Date of Patent: Aug. 26, 2025

(54) MAGNETO-RESISTIVE RANDOM ACCESS MEMORY WITH HEMISPHERICAL TOP ELECTRODE

(71) Applicant: International Business Machines Corporation, Armonk, NY (US)

(72) Inventors: Oscar van der Straten, Guilderland Center, NY (US); Koichi Motoyama, Clifton Park, NY (US); Scott A. DeVries, Albany, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 574 days.

(21) Appl. No.: 17/804,795

(22) Filed: May 31, 2022

(65) Prior Publication Data
US 2023/0389434 A1    Nov. 30, 2023

(51) Int. Cl.
| | |
|---|---|
| G11C 11/16 | (2006.01) |
| H10B 61/00 | (2023.01) |
| H10N 50/01 | (2023.01) |
| H10N 50/10 | (2023.01) |
| H10N 50/80 | (2023.01) |
| H10N 50/85 | (2023.01) |

(52) U.S. Cl.
CPC ........... *H10N 50/01* (2023.02); *G11C 11/161* (2013.01); *H10B 61/00* (2023.02); *H10N 50/10* (2023.02); *H10N 50/80* (2023.02); *H10N 50/85* (2023.02)

(58) Field of Classification Search
CPC .................................................... G11C 11/161
See application file for complete search history.

(56) References Cited

U.S. PATENT DOCUMENTS

| | | | |
|---|---|---|---|
| 7,211,849 B2 | 5/2007 | Hineman |
| 9,559,294 B2 | 1/2017 | Hsu |
| 9,595,662 B2 | 3/2017 | Li |
| 10,522,750 B2 | 12/2019 | Yang |
| 10,535,814 B2 | 1/2020 | Chuang |
| 10,790,439 B2 | 9/2020 | Ku |
| 10,796,911 B2 | 10/2020 | Rizzolo |
| 11,075,335 B2 | 7/2021 | Chuang |
| 11,121,314 B2 | 9/2021 | Yang |
| 11,223,008 B2 | 1/2022 | Rizzolo |

(Continued)

FOREIGN PATENT DOCUMENTS

| | | |
|---|---|---|
| CN | 109087993 A | 12/2018 |
| CN | 111668366 A | 9/2020 |

*Primary Examiner* — Jason Lappas
(74) *Attorney, Agent, or Firm* — Scott Dobson (57) ABSTRACT

A memory device includes a magnetic tunnel junction pillar above a bottom electrode. A sidewall spacer is disposed along sidewalls of the magnetic tunnel junction pillar with an uppermost surface of the sidewall spacer being coplanar with an uppermost surface of the magnetic tunnel junction pillar. A dielectric hardmask composed of an amorphous dielectric material is disposed above a first portion of the uppermost surface of the magnetic tunnel junction pillar, the dielectric hardmask includes a hemispherical shape. A top electrode is located surrounding the dielectric hardmask and above the uppermost surface of the sidewall spacer and a second portion of the uppermost surface of the magnetic tunnel junction pillar extending outwards from the dielectric hardmask.

20 Claims, 7 Drawing Sheets

(56) References Cited

U.S. PATENT DOCUMENTS

| | | |
|---|---|---|
| 2011/0189796 A1 | 8/2011 | Lu |
| 2012/0028373 A1 | 2/2012 | Belen |
| 2013/0075840 A1 | 3/2013 | Satoh |
| 2017/0148978 A1* | 5/2017 | Apalkov ................ H10N 50/10 |
| 2020/0161236 A1 | 5/2020 | Kim |

* cited by examiner

MAGNETO-RESISTIVE RANDOM ACCESS MEMORY WITH HEMISPHERICAL TOP ELECTRODE

BACKGROUND

The present invention generally relates to the field of magnetic storage devices, and more particularly to high performance magneto-resistive random access memory devices.

Magneto-resistive random access memory (MRAM) is a non-volatile random access memory technology in which data is stored by magnetic storage elements. These magnetic storage elements are typically formed from two ferromagnetic plates, each of which can hold a magnetization, separated by a thin dielectric layer, i.e., the tunnel barrier. One of the two plates is a permanent magnet set to a particular polarity; the other plate's magnetization can be changed to match that of an external field to store memory. Such configuration is known as a magnetic tunnel junction (MTJ) pillar.

For high performance MRAM devices based on perpendicular MTJ pillars, well-defined interfaces and interface control are essential. Embedded MTJ pillar structures are usually formed by patterning of blanket MTJ stacks. Typically, a polycrystalline metal is applied as hardmask material for subtractive patterning of blanket MTJ stacks. However, grain boundaries and defects in the polycrystalline metal hardmask can be transferred into the MTJ pillar during patterning, resulting in MTJ pillars with high circular edge roughness (CER) which can negatively impact MRAM performance. Therefore, there is a need for improved designs and techniques that can prevent high circular edge roughness during MTJ patterning.

SUMMARY

According to an embodiment of the present disclosure, a memory device includes a magnetic tunnel junction pillar above a bottom electrode, a sidewall spacer is disposed along sidewalls of the magnetic tunnel junction pillar, an uppermost surface of the sidewall spacer is coplanar with an uppermost surface of the magnetic tunnel junction pillar, a dielectric hardmask composed of an amorphous dielectric material is disposed above a first portion of the uppermost surface of the magnetic tunnel junction pillar, the dielectric hardmask includes a hemispherical shape, and a top electrode surrounding the dielectric hardmask, the top electrode is located above the uppermost surface of the sidewall spacer and above a second portion of the uppermost surface of the magnetic tunnel junction pillar extending outwards from the dielectric hardmask.

According to another embodiment of the present disclosure, a memory device includes a magnetic tunnel junction pillar above a bottom electrode, a sidewall spacer disposed along sidewalls of the magnetic tunnel junction pillar, and a top electrode above a first portion of an uppermost surface of the magnetic tunnel junction pillar, the top electrode includes a hemispherical shape, the sidewall spacer surrounds the top electrode and is located above a second portion of the uppermost surface of the magnetic tunnel junction extending outwards from the top electrode.

According to another embodiment of the present disclosure, a method of forming a memory device includes forming an amorphous dielectric hardmask above a magnetic tunnel junction stack disposed above a bottom electrode, patterning the amorphous dielectric hardmask and the magnetic tunnel junction stack to form a magnetic tunnel junction pillar, trimming the amorphous dielectric hardmask such that the amorphous dielectric hardmask covers a first portion of an uppermost surface of the magnetic tunnel junction pillar, while a second portion of the uppermost surface of the magnetic tunnel junction pillar extending outwards from the amorphous dielectric hardmask remains uncovered, forming a sidewall spacer along sidewalls of the magnetic tunnel junction pillar and the amorphous dielectric hardmask, the sidewall spacer covering the second portion of the uppermost surface of the magnetic tunnel junction pillar, forming an interlevel dielectric layer and patterning the interlevel dielectric layer to form a trench, the trench exposing a top surface of the sidewall spacer and a top surface of the amorphous dielectric hardmask, and selectively removing the sidewall spacer from sidewalls of the amorphous dielectric hardmask, an uppermost surface of a remaining portion of the sidewall spacer is coplanar with the uppermost surface of the magnetic tunnel junction pillar.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

MRAM devices include cells or magnetic storage elements for storing data having a magnetically hard layer (i.e., the reference layer) and a magnetically soft layer (i.e., the free layer) separated by a thin dielectric layer (i.e., the tunnel barrier). This configuration is known as a magnetic tunnel junction (MTJ) pillar. MTJ pillar structures typically include a cobalt (Co)-based synthetic anti-ferromagnet (SAF), a CoFeB-based reference layer, a MgO-based tunnel barrier, a CoFeB-based free layer, and cap layers containing materials such as tantalum (Ta) and/or ruthenium (Ru).

Embedded MTJ structures are usually formed on a bottom electrode (BE) by subtractive patterning of blanket MTJ stacks into pillars between two metal levels. Typically, a polycrystalline metal is applied as hardmask material for subtractive patterning of blanket MTJ stacks. Unfortunately, grain boundaries and defects in the polycrystalline metal hardmask can be transferred into the MTJ pillar during patterning, resulting in MTJ pillars with high circular edge roughness (CER) which can negatively impact MRAM performance.

Therefore, embodiments of the present disclosure provide a memory device, and a method of making the same, in which a hemispherical top electrode is formed by using an amorphous dielectric material as hardmask layer during MRAM stack patterning instead of a polycrystalline metal hardmask. The proposed amorphous dielectric hardmask enables MRAM pillars with low CER. Additional embodiments are provided in which memory devices with hollow and solid hemispherical top electrodes can be formed by implementing the proposed amorphous dielectric hardmask for reducing CER.

A first embodiment by which a memory device with hemispherical top electrode can be formed is described in detailed below by referring to the accompanying drawings in FIGS. 1A-1K; a second embodiment by which the memory device with hemispherical top electrode can be formed is described in detailed below by referring to the accompanying drawings in FIGS. 2A-2B; and a third embodiment by which the memory device with hemispherical top electrode can be formed is described in detailed below by referring to the accompanying drawings in FIGS. 3A-3B.

Figure 1A:
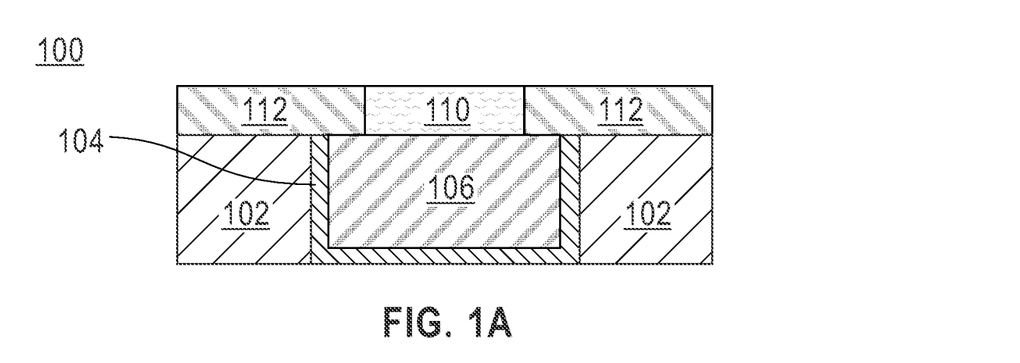
FIG. 1A is a cross-sectional view of a memory device at an intermediate step during a semiconductor manufacturing process, according to an embodiment of the present disclosure.

Referring now to FIG. 1A, a cross-sectional view of a memory device 100 is shown at an intermediate step during a semiconductor manufacturing process, according to an embodiment of the present disclosure. The memory device 100 may include any MTJ-containing device such as, for example, MRAM, spin-transfer torque (STT) MRAM, spin-orbit torque (SOT) MRAM and the like. In the embodiment of FIG. 1, the memory device 100 is an MRAM device based on a perpendicular MTJ pillar structure.

The memory device 100 includes a first conductive structure 106 that is embedded within an interconnect dielectric material or first dielectric layer 102. A first diffusion barrier liner 104 can be formed on sidewalls and a bottom surface of the first conductive structure 106, as shown in the figure. Collectively, the first conductive structure 106, the first diffusion barrier liner 104, and the first dielectric layer 102 provide an interconnect level. It should be noted that at least one other interconnect level and/or a middle-of-the-line (MOL) level may be located beneath the interconnect level formed by the first dielectric layer 102, the first conductive structure 106, and the first diffusion barrier liner 104. These other levels are not shown for clarity.

The first dielectric layer 102 can be composed of any interconnect dielectric material including, for example, silicon dioxide, silsesquioxanes, C doped oxides (i.e., organosilicates) that includes atoms of Si, C, 0 and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first conductive structure 106 is composed of an electrically conductive metal or metal alloy. Examples of electrically conductive materials that may be used in the present application include copper (Cu), aluminum (Al), or tungsten (W), while an example of an electrically conductive metal alloy is a Cu—Al alloy.

As depicted in the figure, the first diffusion barrier liner 104 is formed along a bottom surface and sidewalls of the first conductive structure 106. In some embodiments, no diffusion barrier liner is present. The first diffusion barrier liner 104 is composed of a diffusion barrier material (i.e., a material that serves as a barrier to prevent a conductive material such as copper from diffusing there through). Examples of diffusion barrier materials that can be used in providing the first diffusion barrier liner 104 may include, but are not limited to, Ta, TaN, Ti, TiN, Ru, RuN, RuTa, RuTaN, W, or WN. In some embodiments, the first diffusion barrier liner 104 may include a stack of diffusion barrier materials. In one example, the diffusion barrier material may be composed of a stack of Ta/TaN.

The interconnect level including the first dielectric layer 102, the first conductive structure 106, and the first diffusion barrier liner 104 may be formed utilizing conventional processes that are well-known to those skilled in the art including, for example, a damascene process. So as not to obscure the method of the present application, the techniques used to form the interconnect level including the first dielectric layer 102, the first conductive structure 106, and the first diffusion barrier liner 104 are not provided herein.

With continued reference to FIG. 1A, the memory device 100 may further include a bottom electrode 110 formed within a second dielectric layer 112, as depicted in the figure. In one or more embodiments, the second dielectric layer 112 includes analogous materials and is formed in similar ways as the first dielectric layer 102. According to an embodiment, the bottom electrode 110 is formed above and in electric contact with the first conductive structure 106. The process of forming the bottom electrode 110 is standard and well-known in the art. Generally, the process includes depositing the second dielectric layer 112 above the first conductive structure 106 and the first dielectric layer 102, forming a via or trench feature (not shown) in the second dielectric layer 112 using standard patterning (lithography) and etching techniques until exposing the first conductive structure 106, and then filling the via or trench feature with a conductive material using well-known conformal deposition processes, such as atomic layer deposition (ALD), or chemical vapor deposition (CVD). Non-limiting example of conductive materials for forming the bottom electrode 110 include Ta, TaN, Ti, TiN, Ru, RuN, RuTa, RuTaN, W, WN or any combination thereof. A thickness of the bottom electrode 110 may vary from approximately 2 nm to approximately 25 nm, and ranges therebetween, although a thickness less than 2 nm and greater than 25 nm may be acceptable.

Figure 1B:
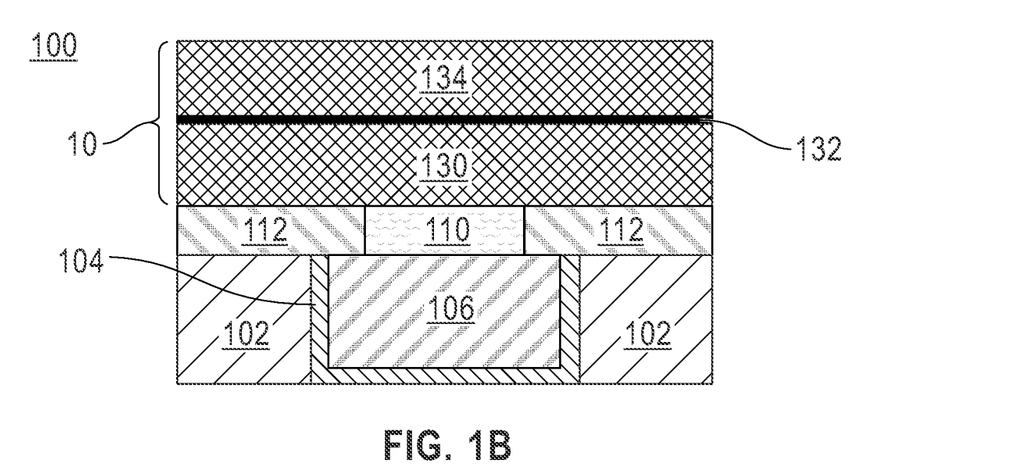
FIG. 1B is a cross-sectional view of the memory device after forming a magnetic tunnel junction stack, according to an embodiment of the present disclosure.

Referring now to FIG. 1B, a cross-sectional view of the memory device 100 is shown after forming an MTJ stack 10 above the bottom electrode 110 and the second dielectric layer 112, according to an embodiment of the present disclosure. The MTJ stack 10 may include, at least in part, a magnetic reference layer 130, a tunnel barrier layer 132, and a magnetic free layer 134 as depicted in the figure. It should be noted that other configurations are possible for the MTJ stack 10 including, for example, the magnetic free layer 134 being located at the bottom of the MTJ stack 10 and the magnetic reference layer 130 being at the top of the MTJ stack 10.

In some embodiments, the MTJ stack 10 may also include a non-magnetic spacer layer (not shown) located on the magnetic free layer, a second magnetic free layer located on the non-magnetic spacer layer, and/or a MTJ cap layer located on the magnetic free layer 134 or on the second magnetic free layer. The various material layers of the MTJ stack 10 can be formed by utilizing one or more deposition processes such as, for example, plating, sputtering, plasma enhanced atomic layer deposition (PEALD), plasma enhanced chemical vapor deposition (PECVD) or physical vapor deposition (PVD).

The magnetic reference layer 130 has a fixed magnetization. The magnetic reference layer 130 may be composed of a metal or metal alloy (or a stack thereof) that includes one or more metals exhibiting high spin polarization. In alternative embodiments, exemplary metals for the formation of the magnetic reference layer 130 may include iron, nickel, cobalt, chromium, boron, or manganese. Exemplary metal alloys may include the metals exemplified by the above. In another embodiment, the magnetic reference layer 130 may be a multilayer arrangement having (1) a high spin polarization region formed from a metal and/or metal alloy using the metals mentioned above, and (2) a region constructed of a material or materials that exhibit strong perpendicular magnetic anisotropy (strong PMA). Exemplary materials with strong PMA that may be used include a metal such as cobalt, nickel, platinum, palladium, iridium, or ruthenium, and may be arranged as alternating layers. The strong PMA region may also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys may be arranged as alternating layers. In one embodiment, combinations of these materials and regions may also be employed.

The tunnel barrier layer 132 is composed of an insulator material and is formed at such a thickness as to provide an appropriate tunneling resistance. Exemplary materials for the tunnel barrier layer 132 may include magnesium oxide, aluminum oxide, and titanium oxide, or materials of higher electrical tunnel conductance, such as semiconductors or low-bandgap insulators.

The magnetic free layer 134 may be composed of a magnetic material (or a stack of magnetic materials) with a magnetization that can be changed in orientation relative to the magnetization orientation of the magnetic reference layer 130. Exemplary magnetic materials for the magnetic free layer 134 include alloys and/or multilayers of cobalt, iron, alloys of cobalt-iron, nickel, alloys of nickel-iron, and alloys of cobalt-iron-boron.

Figure 1C:
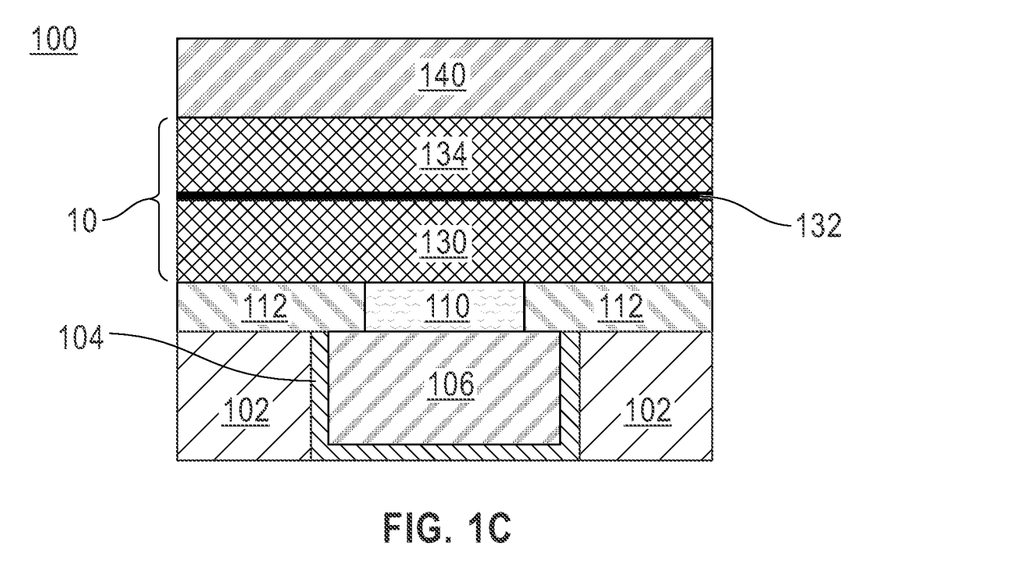
FIG. 1C is a cross-sectional view of the memory device after forming a dielectric hardmask above the magnetic tunnel junction stack, according to an embodiment of the present disclosure.

Referring now to FIG. 1C, a cross-sectional view of the memory device 100 is shown after forming a dielectric hardmask 140 above the MTJ stack 10, according to an embodiment of the present disclosure.

In the depicted embodiment, the dielectric hardmask 140 is formed above the magnetic free layer 134 of the MTJ stack 10. The dielectric hardmask 140 includes an amorphous dielectric material. Non-limiting examples of dielectric materials for forming the dielectric hardmask 140 may include aluminum oxide ($Al_2O_3$), titanium dioxide ($TiO_2$), hafnium oxide ($HfO_2$), and the like. The dielectric hardmask 140 can be deposited by any suitable deposition method known in the art including, for example, atomic layer deposition (ALD), or chemical vapor deposition (CVD). A (vertical) thickness of the dielectric hardmask 140 may vary between approximately 10 nm to approximately 100 nm, although other thicknesses above or below this range may be used as desired for a particular application.

Figure 1D:
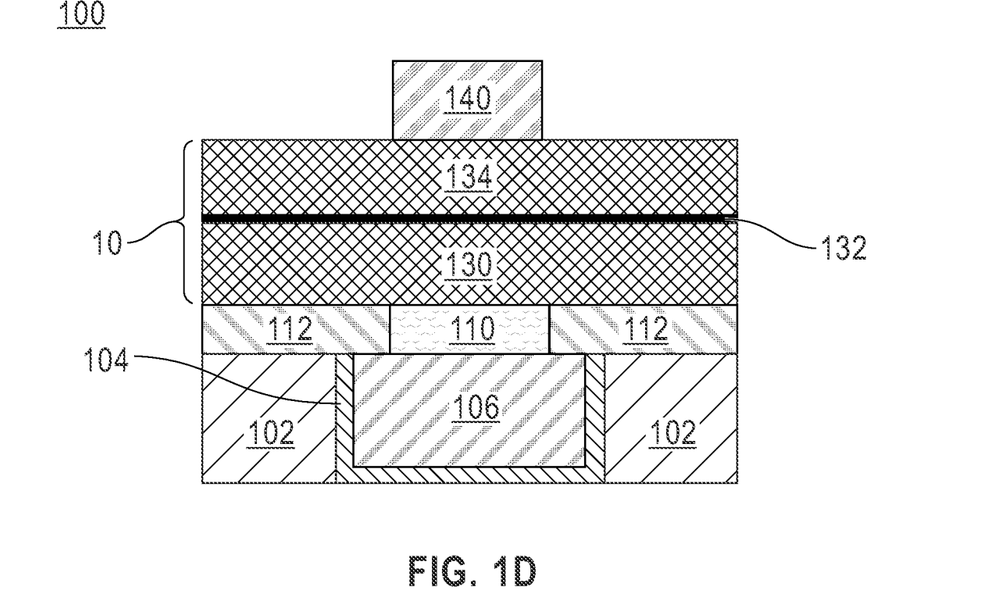
FIG. 1D is a cross-sectional view of the memory device after patterning the dielectric hardmask, according to an embodiment of the present disclosure.
Figure 1E:
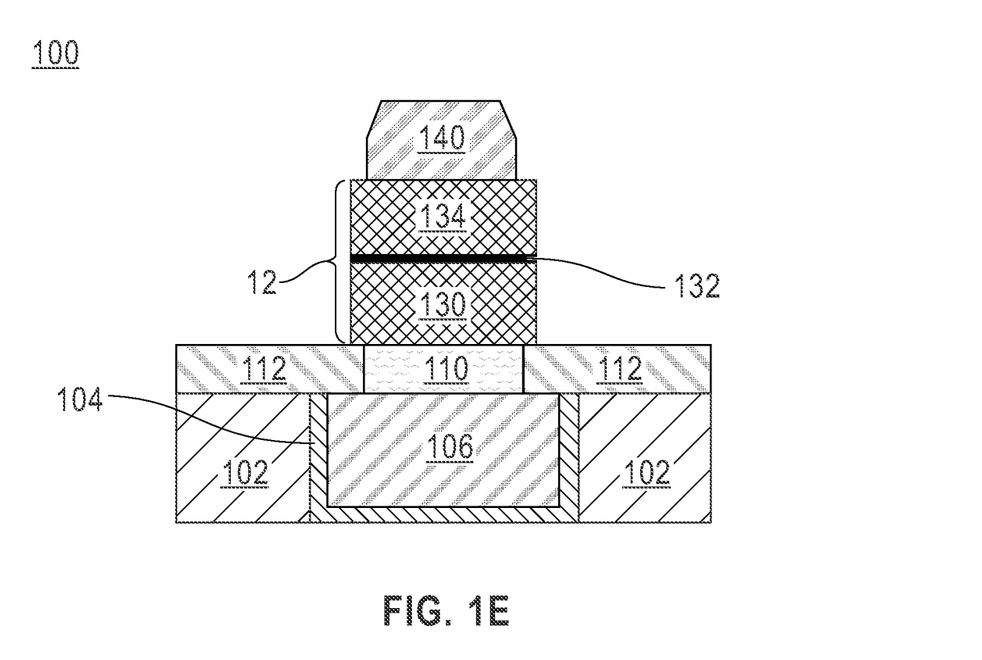
FIG. 1E is a cross-sectional view of the memory device after patterning the magnetic tunnel junction stack to form a magnetic tunnel junction pillar and trimming the dielectric hardmask, according to an embodiment of the present disclosure.

Referring now to FIG. 1D and FIG. 1E simultaneously, cross-sectional views of the memory device 100 are shown after patterning the dielectric hardmask 140 and the MTJ stack 10 to form an MTJ pillar 12, according to an embodiment of the present disclosure.

The process of patterning the MTJ stack 10 consists of steps well-known in the art, which generally include forming a pattern on a photoresist layer (not shown) that is transferred to the dielectric hardmask 140, as shown in FIG. 1D, which is then used to pattern the underlying MTJ stack 10 via any suitable etching technique. Non-limiting examples of etching techniques for patterning the MTJ stack 10 may include reactive-ion etching (RIE) or ion beam etching (IBE). In this embodiment, etching of the MTJ stack 10 is conducted until reaching a top surface of the second dielectric layer 112.

It should be noted that some elements and/or features of the memory device 100 are illustrated in the figures but not described in detail in order to avoid unnecessarily obscuring the presented embodiments. For illustration purposes only, without intent of limitation, only one MTJ pillar 12 is depicted in the figure. As may be understood by those skilled in the art, more than one MTJ pillar 12 can be formed in the memory device 100.

With reference now to FIG. 1E, after forming the MTJ pillar 12, the patterned dielectric hardmask 140 can be trimmed to reduce its critical dimension by approximately 2 nm to 20 nm around its circumference while also reducing sidewall surface roughness. In an exemplary embodiment, trimming of the patterned dielectric hardmask 140 includes performing a reactive ion etch (RIE) process. In another embodiment, hardmask trimming can be conducted using wet removal. It should be noted that due to the amorphous state of the hardmask material, after the trimming process, lateral sidewall surfaces of the dielectric hardmask 140 include a substantially semicircular or hemispherical shape. As depicted in the figure, trimming of the dielectric hardmask 140 exposes lateral portions of the magnetic free layer 134.

Figure 1F:
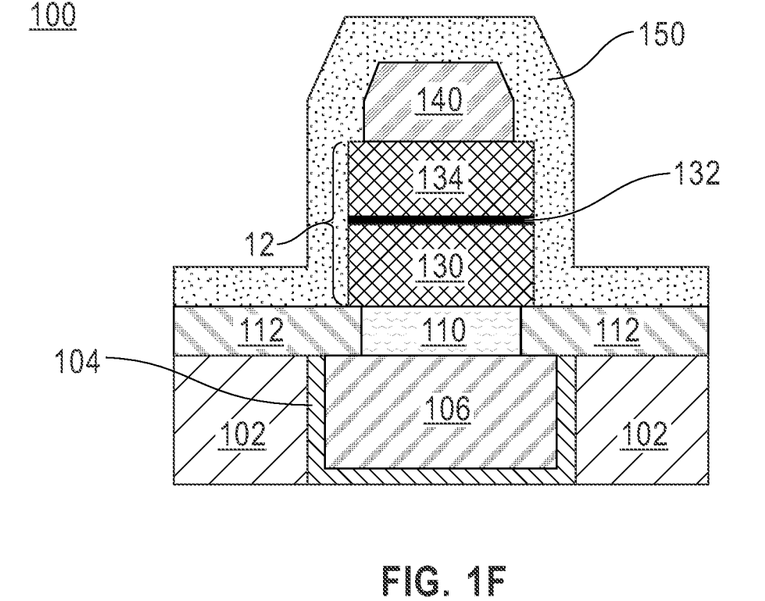
FIG. 1F is a cross-sectional view of the memory device after forming a spacer material, according to an embodiment of the present disclosure.

Referring now to FIG. 1F, a cross-sectional view of the memory device 100 is shown after depositing a spacer material 150, according to an embodiment of the present disclosure.

The spacer material 150 may include an insulator material such as an oxide, nitride, oxynitride, silicon carbon oxynitride, silicon boron oxynitride, low-k dielectric, or any combination thereof. Standard conformal deposition techniques may be used to form the spacer material 150. The spacer material 150 can be deposited on the memory device 100 and then etched to form sidewall spacers, as will be described in detail below.

Figure 1G:
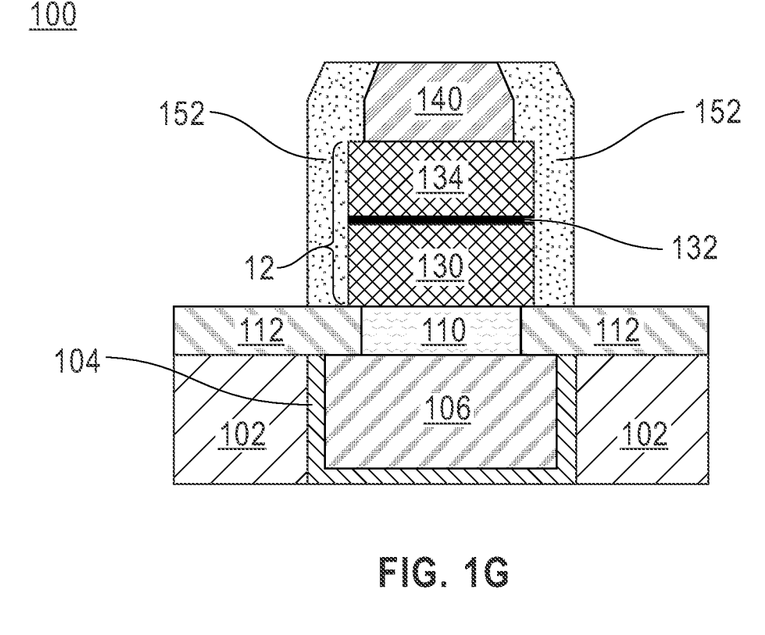
FIG. 1G is a cross-sectional view of the memory device after etching the spacer material and forming sidewall spacers, according to an embodiment of the present disclosure.

Referring now to FIG. 1G, a cross-sectional view of the memory device 100 is shown after etching the spacer material 150 (FIG. 1F) and forming sidewall spacers 152, according to an embodiment of the present disclosure.

The spacer material 150 (FIG. 1F) can be etched using, for example, an anisotropic etch to form the sidewall spacers 152. As depicted in the figure, the spacer material 150 (FIG. 1F) is removed from all horizontal surfaces of the memory device 100 during the etching process.

According to an embodiment, the sidewall spacers 152 are located along sidewalls of the MTJ pillar 12 and dielectric hardmask 140 substantially covering this region of the memory device 100. Stated differently, the sidewall spacers 152 act as an encapsulation material that surrounds and protects the MTJ pillar 12 during subsequent processing steps. In an exemplary embodiment, a (horizontal) thickness of the sidewall spacers 152, as configured in FIG. 1G, may vary between approximately 3 nm to approximately 40 nm, although other thicknesses above or below this range may be used as desired for a particular application.

Figure 1H:
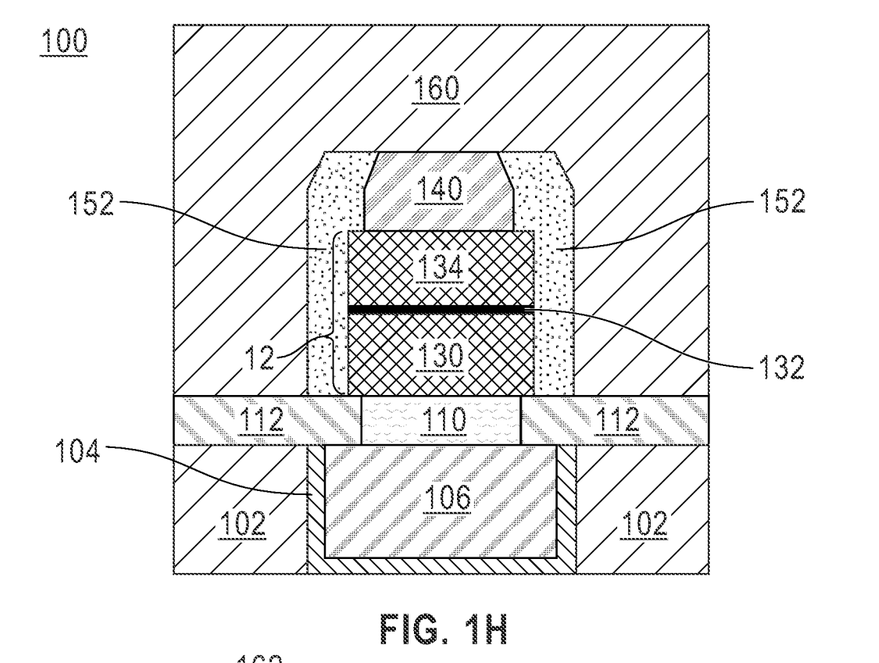
FIG. 1H is a cross-sectional view of the memory device after depositing a third dielectric layer, according to an embodiment of the present disclosure.

Referring now to FIG. 1H, a cross-sectional view of the memory device 100 is shown after forming an interlevel dielectric filling layer or third dielectric layer 160, according to an embodiment of the present disclosure. The third dielectric layer 160 may be made of analogous materials and formed in similar ways as the first dielectric layer 102 and second dielectric layer 112. In some embodiments, a planarization process may be conducted on the memory device 100 after deposition of the third dielectric layer 160.

Figure 1I:
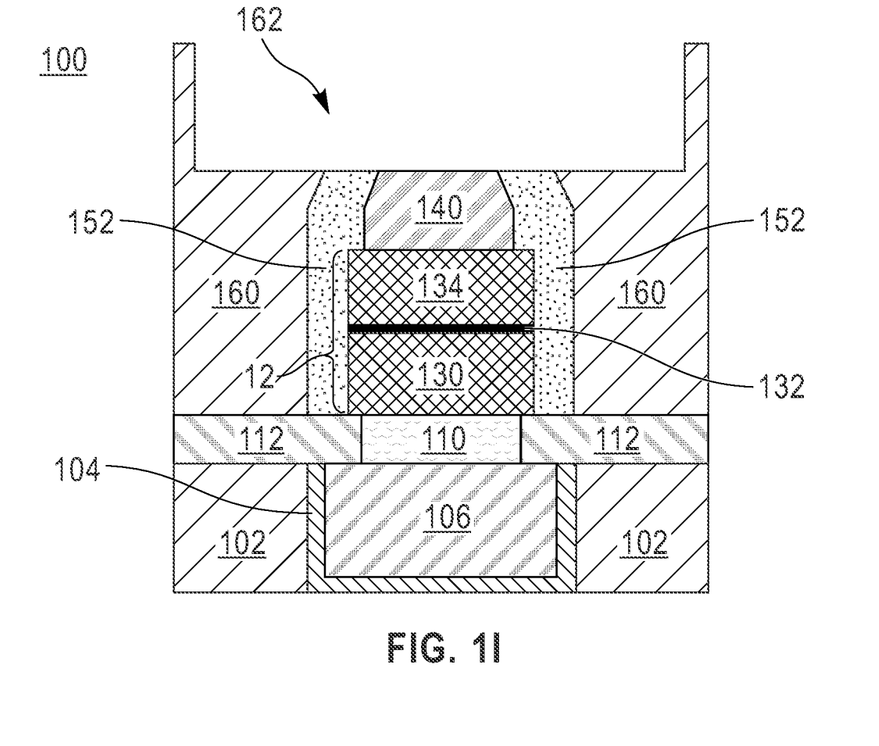
FIG. 1I is a cross-sectional view of the memory device after top contact patterning, according to an embodiment of the present disclosure.
Figure 1J:
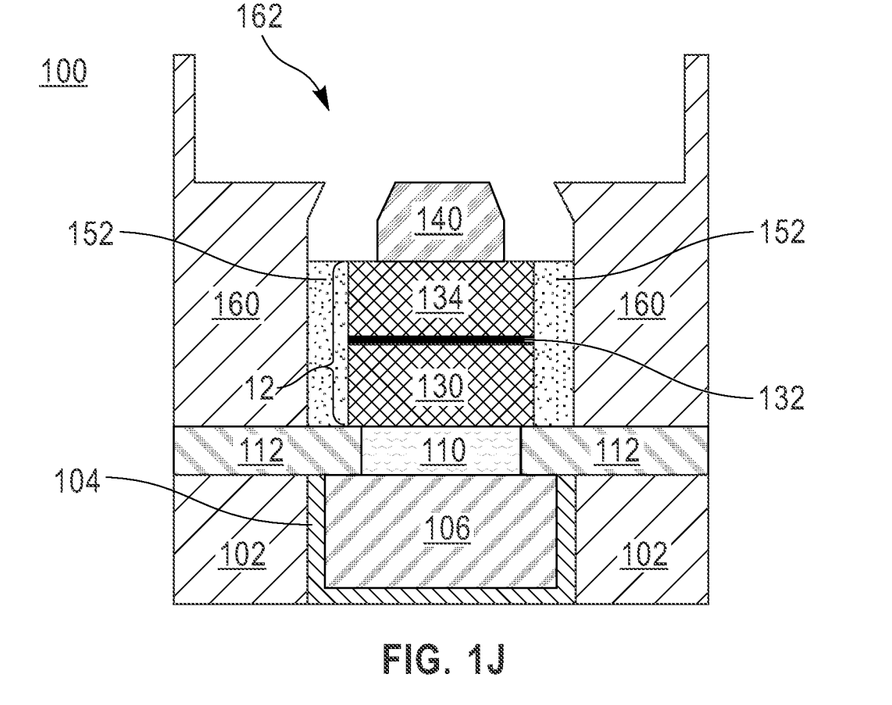
FIG. 1J is a cross-sectional view of the memory device after recessing sidewall spacers, according to an embodiment of the present disclosure.

Referring now to FIG. 1I and FIG. 1J simultaneously, cross-sectional views of the memory device 100 are shown after top contact patterning and recessing sidewall spacers 152, according to an embodiment of the present disclosure.

In this embodiment, top contact patterning may be performed in the third dielectric layer 160 in accordance with typical techniques. For example, top contact patterning can be conducted using a dual damascene technique by which a contact trench 162 is formed in the second dielectric layer 160 and subsequently filled with a conductive interconnect material, as will be described in detail below.

As depicted in FIG. 1I, the contact trench 162 exposes uppermost surfaces of the sidewall spacers 152 and dielectric hardmask 140. According to an embodiment, a top portion of the sidewalls spacers 152 can be selectively removed from the memory device 100, and particularly from sidewalls of the dielectric hardmask 140. As shown in FIG. 1J, removal of the top portion of the sidewall spacers 152 reveals or uncovers the dielectric hardmask 140, as well as upper lateral portions of the magnetic free layer 134 (of the MTJ pillar 12) extending outside the dielectric hardmask 140, i.e., portions of the magnetic free layer 134 not covered by the dielectric hardmask 140. After selectively removing the sidewall spacer 152 from sidewalls of the (amorphous) dielectric hardmask 140, an uppermost surface of a remaining portion of the sidewall spacer 152 is substantially coplanar with the uppermost surface of the MTJ pillar 12, as depicted in FIG. 1J.

Figure 1K:
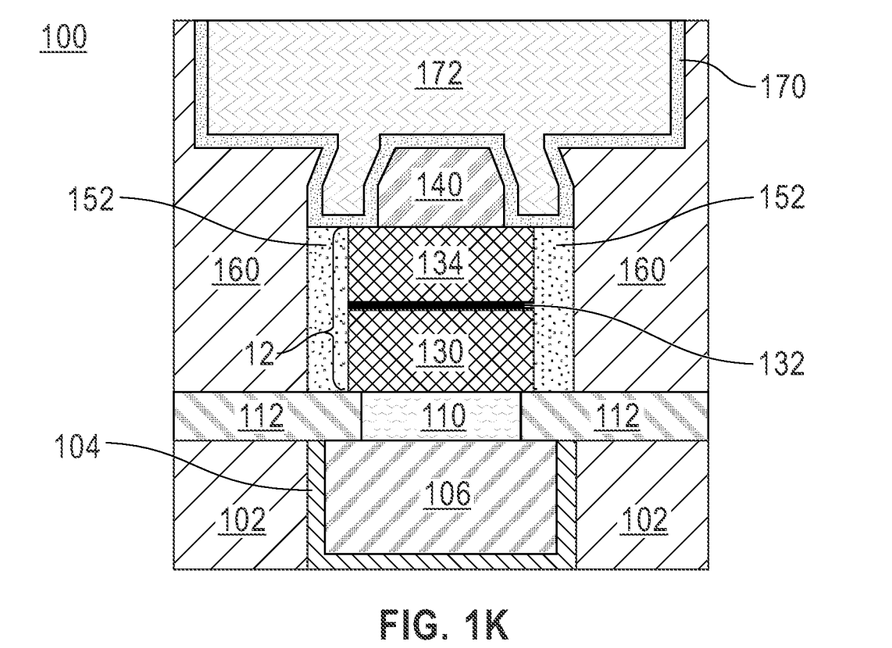
FIG. 1K is a cross-sectional view of the memory device after forming a second conductive structure, according to an embodiment of the present disclosure.

Referring now to FIG. 1K, a cross-sectional view of the memory device 100 is shown after forming a second conductive structure 172, according to an embodiment of the present disclosure.

Forming the second conductive structure 172 includes depositing a conductive interconnect material within the contact trench 162 (FIG. 1J). In one or more embodiments, a second diffusion barrier liner 170 can be formed prior to depositing the conductive interconnect material. In such embodiments, the second diffusion barrier liner 170 can be formed on a bottom surface and sidewalls of the second conductive structure 172, as shown in the figure. In the depicted embodiment, a first portion of the second conductive structure 172 is located above the dielectric hardmask 140, while a second portion of the second conductive structure 172 extends along sidewalls of the dielectric hardmask 140 substantially surrounding an upper surface of the dielectric hardmask 140 for providing a top electrode with hemispherical leads that electrically connect the second conductive structure 172 to the MTJ pillar 12.

Similar to the first conductive structure 106, the second conductive structure 172 may be composed of a conductive interconnect material such as Cu, Al, or W, while the second barrier liner 170 may include Ta, TaN, Ti, TiN, Ru, RuN, RuTa, RuTaN, W, or WN. The conductive interconnect material may be formed using a filling technique such as electroplating, electroless plating, chemical vapor deposition, physical vapor deposition or a combination of methods. A seed layer (not shown) may optionally be deposited prior to filling the trench using an electroplating technique. In one or more embodiments, a planarization process is conducted after forming the second conductive structure 172.

More particularly, according to the depicted embodiment, the sidewall spacer 152 is disposed along sidewalls of the MTJ pillar 12, with an uppermost surface of the sidewall spacer 152 being coplanar with an uppermost surface of the MTJ pillar 12. The dielectric hardmask 140 including the amorphous dielectric material is disposed above a first portion of the uppermost surface of the magnetic tunnel junction pillar 12. The second interconnect structure 172 provides a (hemispherical) top electrode that substantially surrounds the dielectric hardmask 140 in a way such that the top electrode is located above the uppermost surface of the sidewall spacer 152 and above a second portion of the uppermost surface of the magnetic tunnel junction pillar 12 extending outwards from the dielectric hardmask 140.

Thus, the second conductive structure 172 formed surrounding the dielectric hardmask 140 provides a hemispherical top electrode for the memory device 100. The curved, crescent-like shape of the dielectric hardmask 140 allows the formation of the hemispherical second conductive structure 172 (i.e., top electrode). Accordingly, by utilizing an amorphous dielectric hardmask during MTJ patterning instead of a polycrystalline metal hardmask, embodiments of the present disclosure, can prevent high circular edge roughness typical of MTJ devices.

The following described figures provide alternate embodiments by which the memory device 100 with hemispherical top electrode can be formed using the dielectric hardmask 140.

Figure 2A:
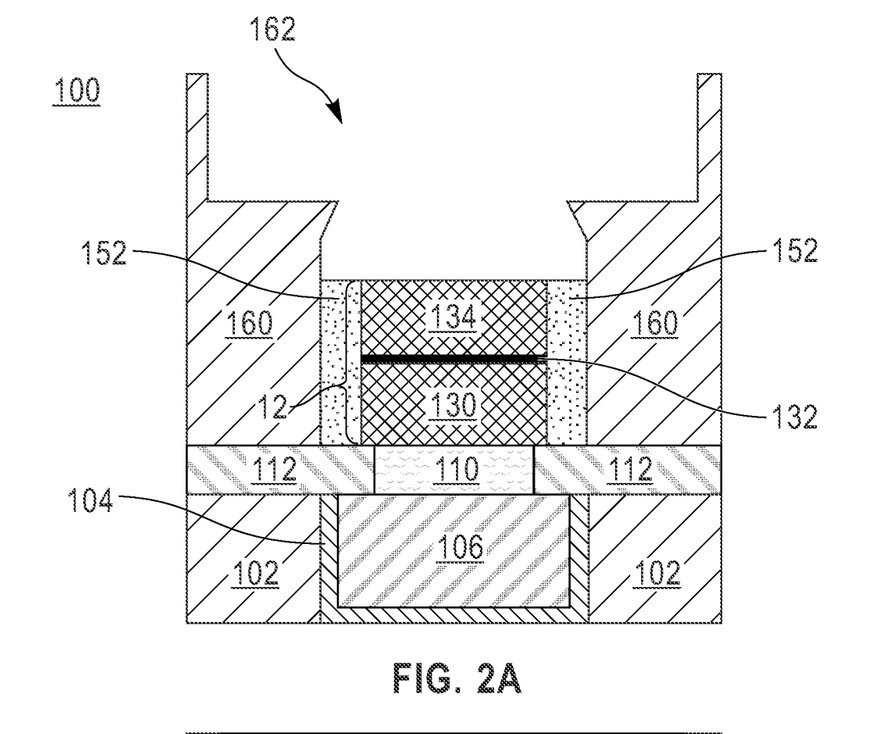
FIG. 2A is a cross-sectional view of the memory device after removing the dielectric hardmask, according to an alternate embodiment of the present disclosure.
Figure 2B:
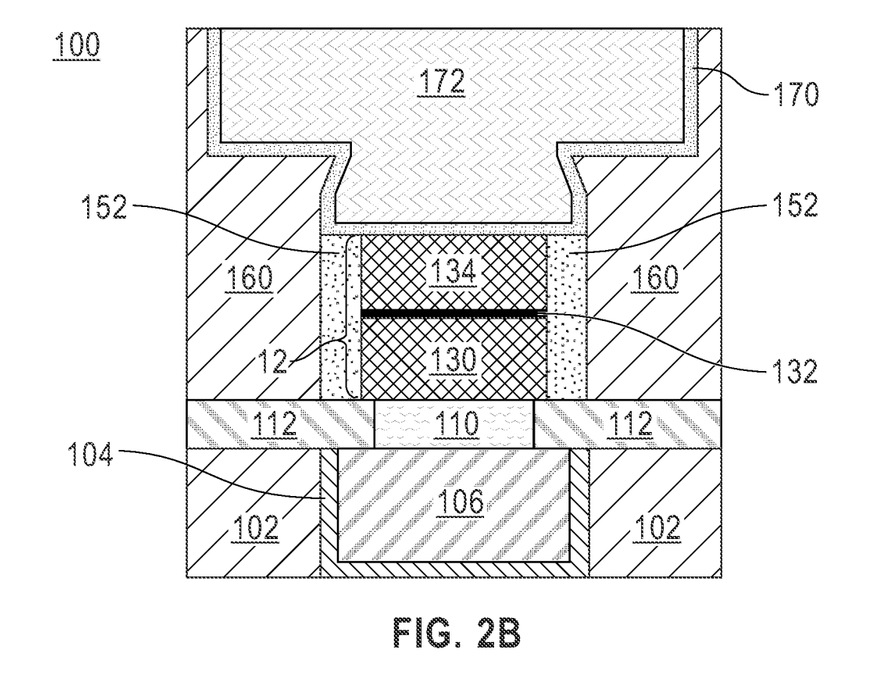
FIG. 2B is a cross-sectional view of the memory device after forming the second conductive structure, according to an alternate embodiment of the present disclosure.

Referring now to FIGS. 2A-2B simultaneously, cross-sectional views of the memory device 100 are shown after removing the dielectric hardmask 140 and forming the second conductive structure 172, according to an alternate embodiment of the present disclosure.

In this embodiment, after the step of recessing sidewall spacers 152 depicted in FIG. 1J above, the dielectric hardmask 140 can be selectively removed from the semiconductor structure using any suitable etching technique. Non-limiting examples of etching processes to remove the dielectric hardmask 140 may include dry methods such as reactive ion etch (RIE), or wet removal.

After recessing sidewall spacers 152 and removing the dielectric hardmask 140 (FIG. 1J), an uppermost surface of the remaining sidewalls spacers 152 and an uppermost surface of the magnetic free layer 134 of the MTJ pillar 12 are exposed, as depicted in FIG. 2A. The process continues by forming the second conductive structure 172, as illustrated in FIG. 2B. In this embodiment, the second conductive structure 172 is located above an entire top surface of the MTJ pillar 12. Stated differently, the second conductive structure 172 covers a totality of an uppermost surface of the MTJ pillar 12.

It should be noted that details of previously described features and techniques have been omitted to avoid unnecessarily obscuring the presented embodiments.

Figure 3A:
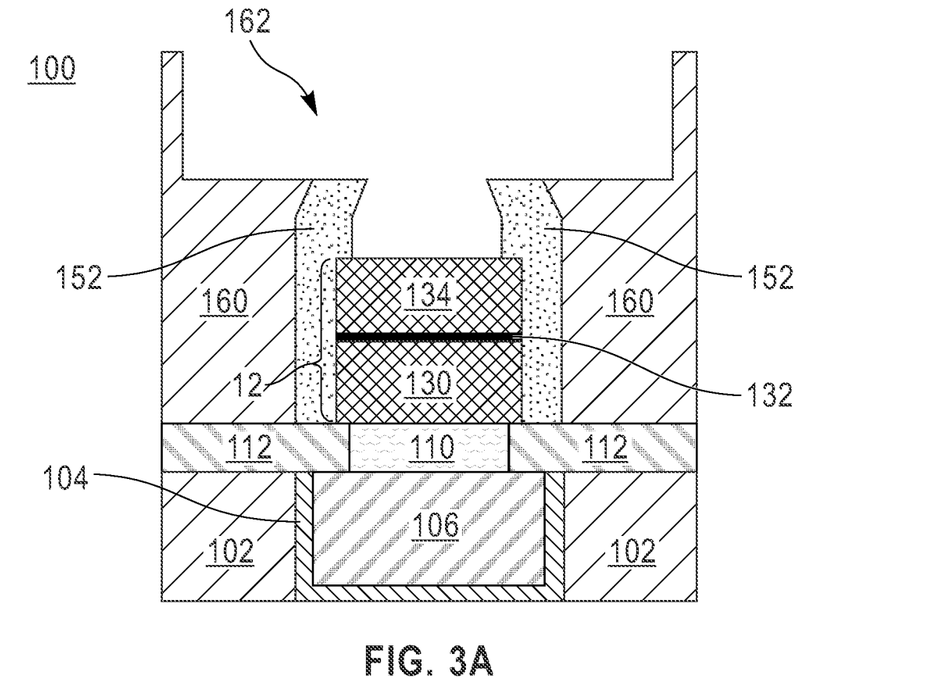
FIG. 3A is a cross-sectional view of the memory device after removing the dielectric hardmask to form a space between sidewalls spacers, according to an alternate embodiment of the present disclosure.
Figure 3B:
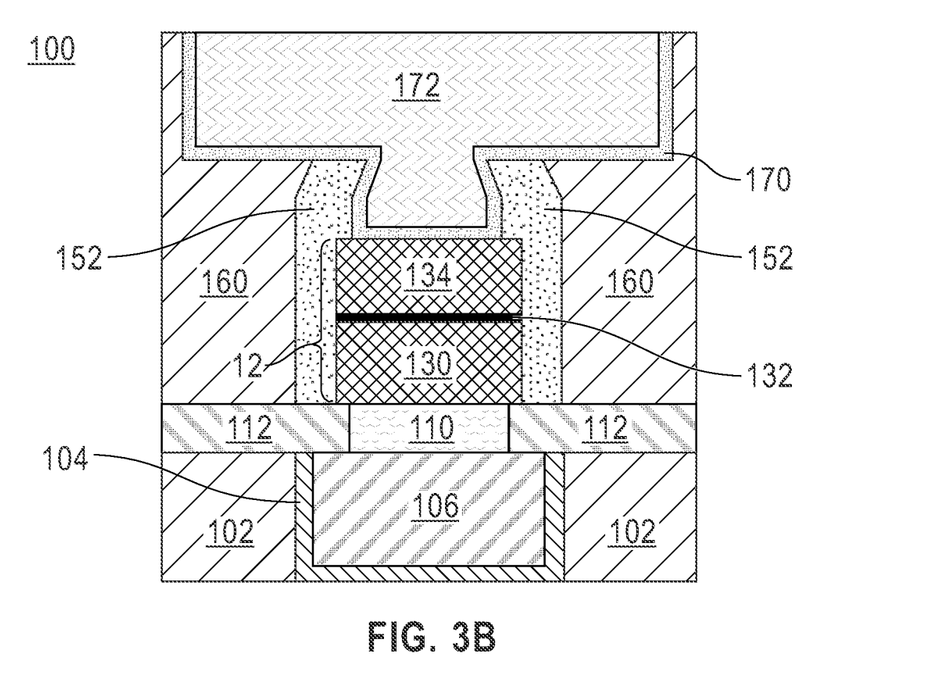
FIG. 3B is a cross-sectional view of the memory device after forming the second conductive structure within the recess between sidewall spacers, according to an embodiment of the present disclosure.

Referring now to FIGS. 3A-3B simultaneously, cross-sectional views of the memory device 100 are shown after removing the dielectric hardmask 140 and forming the second conductive structure 172, according to an alternate embodiment of the present disclosure.

In this embodiment, after the step of top contact patterning depicted in FIG. 1I in which the contact trench 162 is formed within the third dielectric layer 160, the dielectric hardmask 140 is removed from the memory device 100. In this embodiment, the sidewalls spacers 152 are not recessed prior to removing the hardmask layer 140. As can be observed in FIG. 3A, lateral portions of the magnetic free layer 134 on opposing sides of the MTJ pillar 12 are partially covered by the sidewall spacers 152 (due to the trimming of the dielectric hardmask 140 prior to forming the sidewall spacers 152). As mentioned above, non-limiting examples of etching processes to remove the dielectric hardmask 140 may include dry methods such as reactive ion etch (RIE), or wet removal.

The process continues by forming the second conductive structure 172, as illustrated in FIG. 3B. In this embodiment, the second conductive structure 172 is located above an exposed top portion of the magnetic free layer 134 of the MTJ pillar 12 (i.e., the portion not covered by the sidewall spacers 152). As mentioned above, details of previously described features and techniques have been omitted to avoid unnecessarily obscuring the presented embodiments.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A memory device, comprising:
a magnetic tunnel junction pillar above a bottom electrode;
a sidewall spacer disposed along sidewalls of the magnetic tunnel junction pillar, an uppermost surface of the sidewall spacer being coplanar with an uppermost surface of the magnetic tunnel junction pillar;
a dielectric hardmask comprising an amorphous dielectric material disposed above a first portion of the uppermost surface of the magnetic tunnel junction pillar, the dielectric hardmask comprising a hemispherical shape; and
a top electrode surrounding the dielectric hardmask, the top electrode being located above the uppermost surface of the sidewall spacer and above a second portion of the uppermost surface of the magnetic tunnel junction pillar extending outwards from the dielectric hardmask.

2. The memory device of claim 1, further comprising:
a first conductive structure embedded within a first interconnect dielectric material, the bottom electrode being above and electrically connected to the first conductive structure.

3. The memory device of claim 1, wherein the magnetic tunnel junction pillar comprises a magnetic reference layer above the bottom electrode; a tunnel barrier layer above the magnetic reference layer; and a magnetic free layer above the tunnel barrier layer.

4. The memory device of claim 1, wherein the top electrode further comprises a diffusion barrier liner located on a bottom surface and lateral sidewalls of the top electrode.

5. The memory device of claim 1, wherein the amorphous dielectric material comprises at least one of amorphous aluminum oxide, amorphous titanium dioxide, and amorphous hafnium oxide.

6. A memory device, comprising:
a magnetic tunnel junction pillar above a bottom electrode;
a sidewall spacer disposed along sidewalls of the magnetic tunnel junction pillar; and
a top electrode above a first portion of an uppermost surface of the magnetic tunnel junction pillar, the top electrode including a hemispherical shape, the sidewall spacer surrounding the top electrode and being located above a second portion of the uppermost surface of the magnetic tunnel junction extending outwards from the top electrode.

7. The memory device of claim 6, wherein an uppermost surface of the sidewall spacer is coplanar with the first portion and the second portion of the uppermost surface of the magnetic tunnel junction pillar.

8. The memory device of claim 7, wherein the top electrode is above the uppermost surface of the sidewall spacer and above the uppermost surface of the magnetic tunnel junction pillar.

9. The memory device of claim 6, further comprising:
a first conductive structure embedded within a first interconnect dielectric material, the bottom electrode being above and electrically connected to the first conductive structure.

10. The memory device of claim 6, wherein the magnetic tunnel junction pillar comprises a magnetic reference layer above the bottom electrode; a tunnel barrier layer above the magnetic reference layer; and a magnetic free layer above the tunnel barrier layer.

11. The memory device of claim 6, wherein the top electrode further comprises a diffusion barrier liner located on a bottom surface and lateral sidewalls of the top electrode.

12. A method of forming a memory device, comprising:
forming an amorphous dielectric hardmask above a magnetic tunnel junction stack disposed above a bottom electrode;
patterning the amorphous dielectric hardmask and the magnetic tunnel junction stack to form a magnetic tunnel junction pillar;
trimming the amorphous dielectric hardmask such that the amorphous dielectric hardmask covers a first portion of an uppermost surface of the magnetic tunnel junction pillar, while a second portion of the uppermost surface of the magnetic tunnel junction pillar extending outwards from the amorphous dielectric hardmask remains uncovered;
forming a sidewall spacer along sidewalls of the magnetic tunnel junction pillar and the amorphous dielectric hardmask, the sidewall spacer covering the second portion of the uppermost surface of the magnetic tunnel junction pillar;
forming an interlevel dielectric layer and patterning the interlevel dielectric layer to form a trench, the trench exposing a top surface of the sidewall spacer and a top surface of the amorphous dielectric hardmask; and
selectively removing the sidewall spacer from sidewalls of the amorphous dielectric hardmask, wherein an uppermost surface of a remaining portion of the sidewall spacer is coplanar with the uppermost surface of the magnetic tunnel junction pillar.

13. The method of claim 12, further comprising:
depositing a conductive material within the trench for forming an electrically conductive structure, the electrically conductive structure surrounding the amorphous dielectric hardmask.

14. The method of claim 12, wherein the amorphous dielectric hardmask includes a hemispherical shape for providing a hemispherical electrically conductive structure.

15. The method of claim 13, wherein the electrically conductive structure further comprises a diffusion barrier liner located on a bottom surface and lateral sidewalls of the electrically conductive structure.

16. The method of claim 12, wherein the amorphous dielectric material comprises at least one of amorphous aluminum oxide, amorphous titanium dioxide, and amorphous hafnium oxide.

17. The method of claim 13, further comprising:
removing the amorphous dielectric hardmask.

18. The method of claim 13, further comprising:
depositing the conductive material within the trench for forming the electrically conductive structure, wherein the electrically conductive structures covers a totality of the uppermost surface of the magnetic tunnel junction pillar.

19. The method of claim 18, wherein the sidewall spacer remains along sidewalls of a portion of the electrically conductive structure in contact with the magnetic tunnel junction pillar.

20. The method of claim 12, wherein the magnetic tunnel junction stack comprises a magnetic reference layer above the bottom electrode; a tunnel barrier layer above the magnetic reference layer; and a magnetic free layer above the tunnel barrier layer.

* * * * *